(12) United States Patent
Hendrickson et al.

(10) Patent No.: US 8,923,068 B2
(45) Date of Patent: Dec. 30, 2014

(54) LOW MARGIN READ OPERATION WITH CRC COMPARISION

(71) Applicant: Micron Technology, Inc., Boise, ID (US)

(72) Inventors: Nicholas Hendrickson, Rancho Cordova, CA (US); Yihua Zhang, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 238 days.

(21) Appl. No.: 13/663,915

(22) Filed: Oct. 30, 2012

(65) Prior Publication Data

US 2014/0119129 A1    May 1, 2014

(51) Int. Cl.
    *G11C 16/06*      (2006.01)

(52) U.S. Cl.
    USPC .............. 365/185.22; 365/185.09; 365/185.2; 365/185.24

(58) Field of Classification Search
    USPC ................ 365/185.22, 185.2, 185.09, 185.24
    See application file for complete search history.

(56) References Cited

U.S. PATENT DOCUMENTS

| | | | | |
|---|---|---|---|---|
| 5,179,536 A * | 1/1993 | Kasa et al. | | 365/200 |
| 5,991,197 A * | 11/1999 | Ogura et al. | | 365/185.11 |
| 6,618,299 B2 * | 9/2003 | Sohn et al. | | 365/200 |
| 6,829,167 B2 | 12/2004 | Tu et al. | | |
| 7,710,781 B2 | 5/2010 | Haque et al. | | |
| 8,065,574 B1 | 11/2011 | Cheng et al. | | |
| 8,179,731 B2 * | 5/2012 | Vigoda et al. | | 365/189.15 |
| 8,599,614 B2 * | 12/2013 | Miida et al. | | 365/185.14 |
| 8,730,738 B2 * | 5/2014 | Oh et al. | | 365/185.22 |
| 2007/0047314 A1 | 3/2007 | Goda et al. | | |

* cited by examiner

*Primary Examiner* — Pho M Luu
(74) *Attorney, Agent, or Firm* — Dicke, Billig & Czaja, PLLC

(57) ABSTRACT

A method for a low margin read operation that compares CRC codes receives known data and a CRC code generated from the known data. A CRC code is generated from data read from a memory cell at a first low margin reference voltage. The CRC code from the known data and the CRC code from the read data are compared and, if the codes do not match, a failed read operation is indicated. If the CRC codes do match, data is read from the memory cell at a second low margin reference voltage that is greater than the first low margin reference voltage. A CRC is generated from this read operation. If the two CRC codes match, the read operation is indicated as passed.

25 Claims, 6 Drawing Sheets

US 8,923,068 B2

LOW MARGIN READ OPERATION WITH CRC COMPARISION

TECHNICAL FIELD

The present embodiments relate generally to memory and a particular embodiment relates to low margin read operations.

BACKGROUND

Non-volatile memory is presently designed into a large number of electronic devices that require relatively permanent storage of data even after power is removed. Common uses for non-volatile memory include personal computers, solid state drives, digital cameras, and cellular telephones. For example, program code and system data such as a basic input/output system (BIOS) are typically stored in non-volatile memory for use in personal computer systems.

Problems can occur during read operations in a non-volatile memory device that can result in unreliable data being obtained. For example, if a memory cell has been weakly programmed (e.g., soft programmed), the threshold voltage of that memory cell might be below the low margin threshold voltage during a read operation.

FIG. 1 illustrates a typical prior art diagram of two threshold voltage distributions 101, 102 with a soft programmed memory cell 100. The distributions 101, 102 each represent a different expected placement of memory cells programmed to that particular logic value. For example, one distribution 101 at the positive threshold voltages represents the memory cells programmed to a logic '0'. The distribution 102 that includes the negative threshold voltages represents the memory cells at a logic '1' (e.g., erased).

A soft programmed memory cell 100 might fall outside of both distributions 101, 102 and can result in a reliability problem. While this memory cell 100 might have been meant to be programmed to the logical '0' state, when this memory cell 100 is read, it might be read as either a logical '0' or a logical '1' (e.g., still erased), depending on its threshold voltage.

For the reasons stated above and for other reasons that will become apparent to those skilled in the art upon reading and understanding the present specification, there is a need in the art for a way to more reliably read soft programmed memory cells.

DETAILED DESCRIPTION

Figure 1:
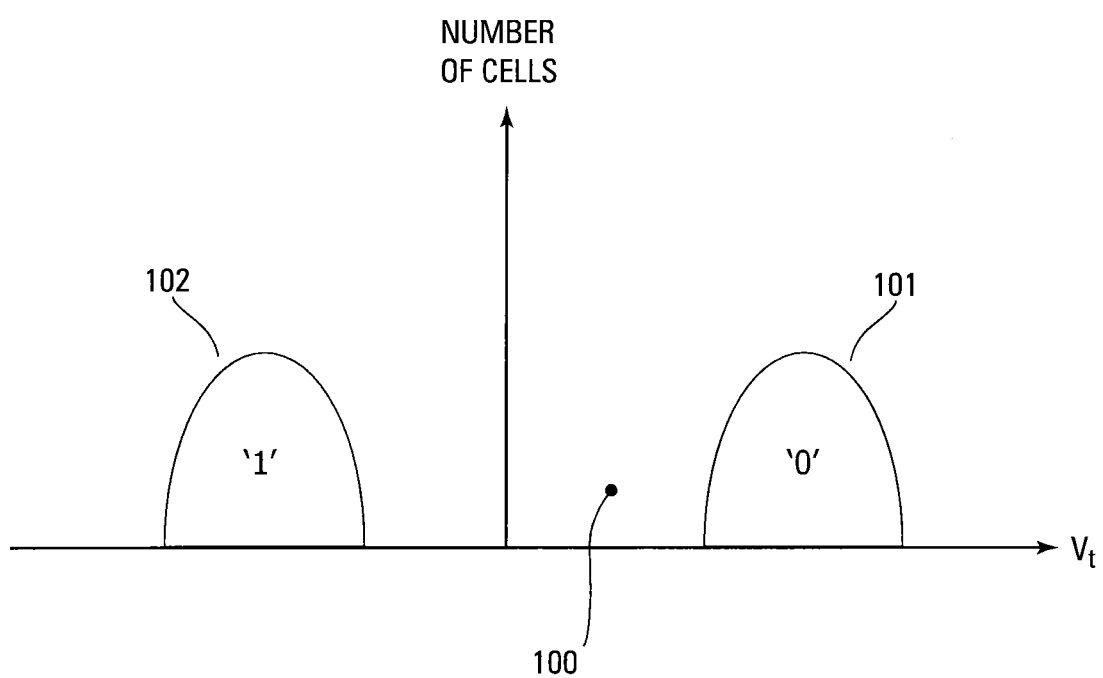
FIG. 1 shows a typical prior art threshold voltage distribution diagram with a soft programmed memory cell.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2:
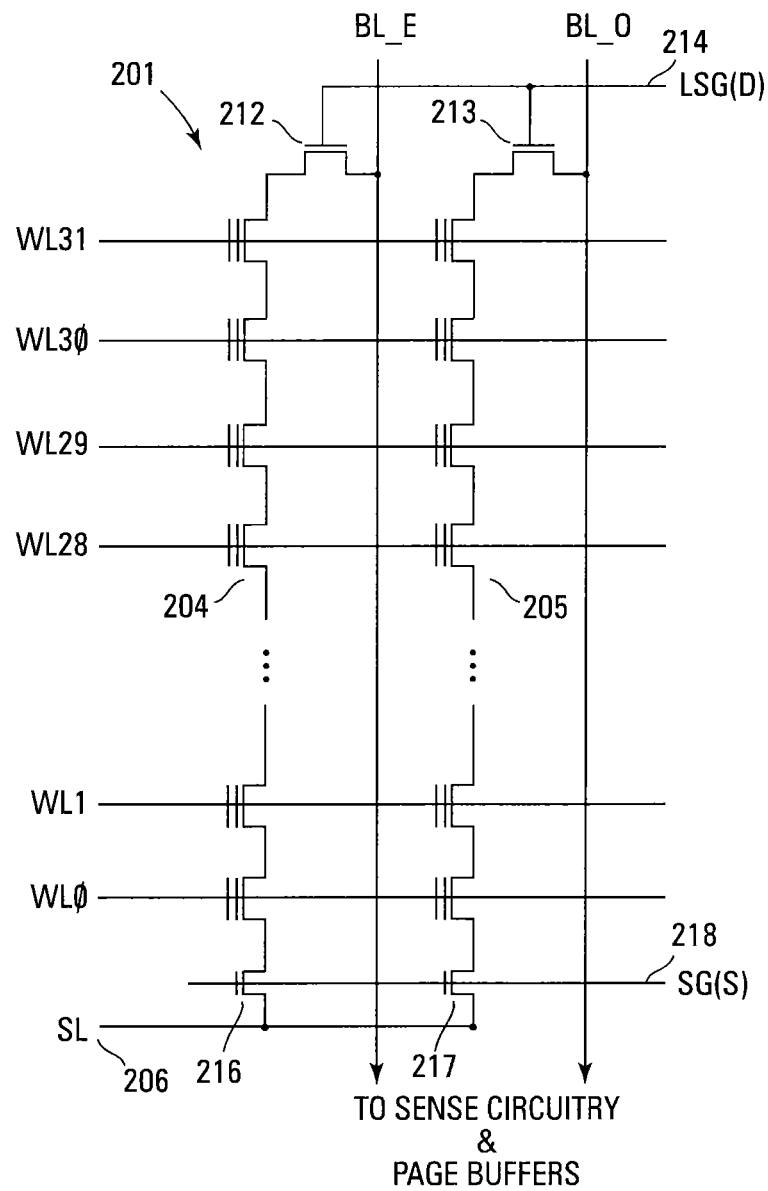
FIG. 2 shows a schematic diagram of one embodiment of a portion of a NAND architecture memory array.

FIG. 2 illustrates a schematic diagram of one embodiment of a portion of a NAND architecture memory array 201 comprising series strings of non-volatile memory cells. This figure illustrates just one example of memory cells and a memory architecture that can be read using the low margin read operation embodiments disclosed herein. The present embodiments of the memory array are not limited to the illustrated NAND architecture.

The memory array 201 comprises an array of non-volatile memory cells (e.g., floating gate) arranged in columns such as series strings 204, 205. Each of the cells is coupled drain to source in each series string 204, 205. An access line (e.g., word line) WL0-WL31 that spans across multiple series strings 204, 205 is coupled to the control gates of each memory cell in a row in order to bias the control gates of the memory cells in the row. Data lines, such as even/odd bit lines BL_E, BL_O, are coupled to the series strings and eventually coupled to sense circuitry that detects the state of each cell by sensing current or voltage on a selected bit line.

Each series string 204, 205 of memory cells is coupled to a source line 206 by a source select gate 216, 217 (e.g., transistor) and to an individual bit line BL_E, BL_O by a drain select gate 212, 213 (e.g., transistor). The source select gates 216, 217 are controlled by a source select gate control line SG(S) 218 coupled to their control gates. The drain select gates 212, 213 are controlled by a drain select gate control line SG(D) 214.

In a typical programming operation of the memory array, each memory cell can be individually programmed as either a single level cell (SLC) or a multiple level cell (MLC). During a typical read operation or program verify operation, a memory cell's threshold voltage ($V_t$) is read as an indication of the data stored in the cell. For example, in an SLC, a $V_t$ of 2.5V might indicate a programmed cell (e.g., logical '0' state) while a $V_t$ of –0.5V might indicate an erased cell (e.g., logical '1' state). An MLC uses multiple $V_t$ ranges that each indicates a different state. Multiple level cells can take advantage of the analog nature of a traditional flash cell by assigning a different bit pattern to each $V_t$ range.

The low margin read operations illustrated in the subsequently discussed embodiments combine a low margin read voltage and a cyclic redundancy check (CRC) code comparison to perform a low margin read operation. The combination of these elements can provide a relatively higher reliability read operation of soft programmed memory cells.

Figure 3:
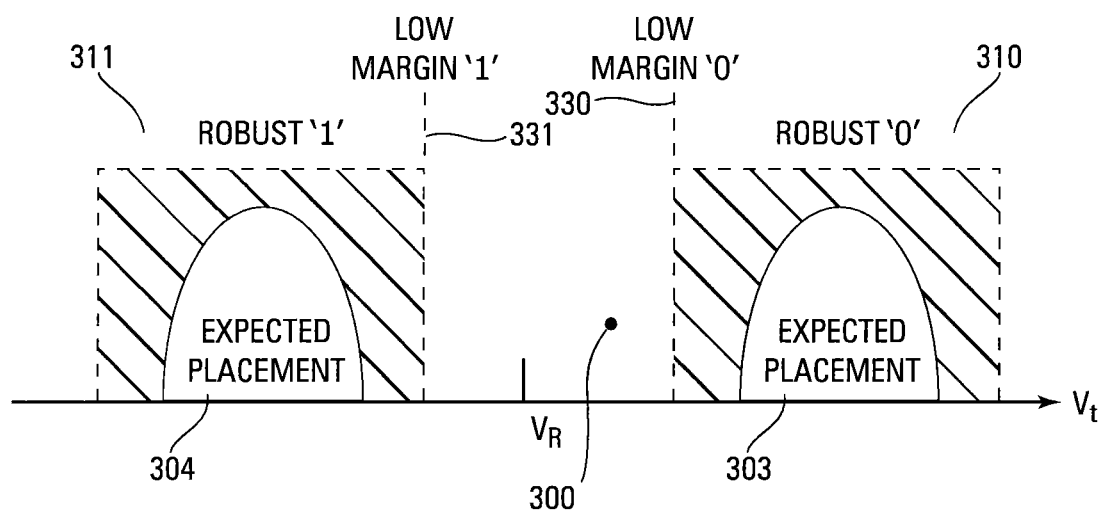
FIG. 3 shows a threshold voltage distribution diagram incorporating a low margin read of a soft programmed memory cell.

FIG. 3 illustrates a threshold voltage distribution diagram incorporating a low margin read of a soft programmed memory cell. The distributions 303, 304 of FIG. 3 include a distribution 303 of memory cells programmed to a threshold voltage indicating a logical '0' state and a distribution 304 of memory cells at a threshold voltage indicating a logical '1' state. In one embodiment, the memory cells at the logical '1' state are typically at a negative threshold voltage indicating an erased state.

The threshold voltage distributions 303, 304 are accompanied by margins for noise and/or data loss while still being a robust placement. These margins are illustrated in FIG. 3 as the robust '0' area 310 and the robust '1' area 311 that are located around their respective threshold voltage distributions 303, 304. Use of the term "robust" refers to the data having a statistically low error rate.

A low margin '0' reference voltage 330 is used as a lower limit of the robust '0' area 310. A low margin '1' reference voltage 331 is used as an upper limit of the robust '1' area 311. The present embodiment use these reference voltages during system reads of the memory cells so that a soft programmed memory cell 300 that falls outside of a robust range 310, 311 can be identified after programming.

A soft programmed memory cell 300 of FIG. 3 is indicated as having a threshold voltage that is less than the low margin '0' reference voltage. Since this soft programmed memory cell 300 has a threshold voltage that is less than the low margin '0' reference voltage, it might be read as either a logical '0' state or a logical '1' state. To improve the reliability of the read, in one embodiment, a read voltage ($V_R$) that is less than the low margin '0' reference voltage can be used.

Figure 4:
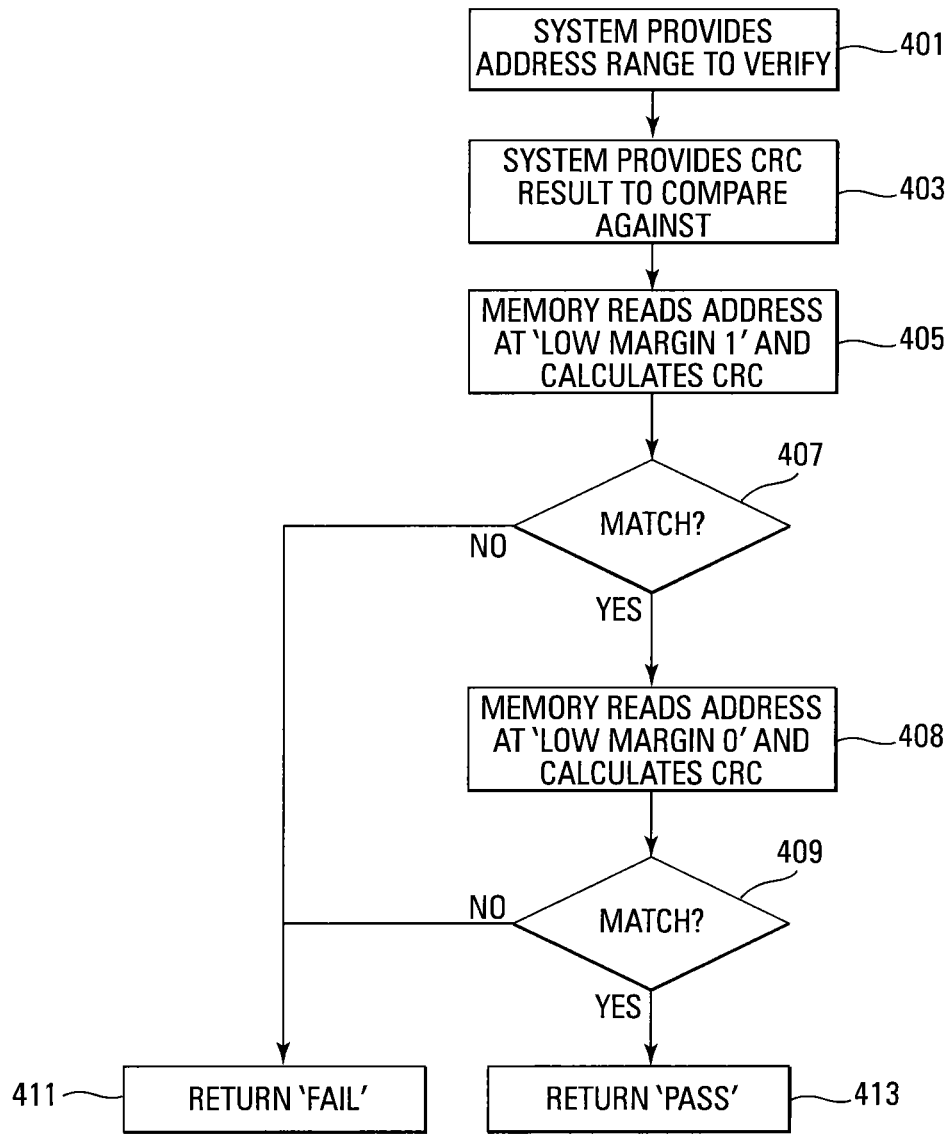
FIG. 4 shows a flow chart of one embodiment of a method for a low margin read operation using a CRC comparison.

FIG. 4 illustrates a flow chart of one embodiment of a method for a low margin read operation using a CRC comparison. This method combines a low margin read, as shown in FIG. 3, with a CRC check.

A memory address range of memory cells to be read (e.g., program verified) is received from a system host (e.g., controller) 401. The host has also computed the CRC code for the data to be read and transmits that CRC code to the memory device for later comparison 403.

The memory device (e.g., memory control circuitry) reads the memory cells in the address range using the low margin '1' reference voltage and uses the read data to calculate a CRC code 405. This read with the low margin '1' reference voltage determines if the programmed bit is at or above this reference voltage. The calculated CRC code is compared with the CRC code provided by the system host 407. In one embodiment, any CRC algorithm can be used to perform this calculation.

If the calculated CRC code does not match the provided CRC code (e.g., known CRC code), a read failure has occurred 411 since the read data is less than the low margin '1' reference voltage. The read operation is indicated as failed 411 to the system host or other controlling device.

If the calculated CRC code matches the provided CRC code, the memory device reads the memory cells in the address range using the low margin '0' reference voltage and calculates a second CRC code from this read data 408. This step determines if the memory cell is programmed at or above the low margin '0' reference voltage. The second CRC code is compared to the CRC code provided by the system host 409.

If the second calculated CRC code does not match the provided CRC code, a read failure has occurred 411 because the memory cell is programmed between the low margin '1' reference voltage and the low margin '0' reference voltage. The state of the memory cell is therefore unknown. The read operation is indicated as having failed 411 to the system host or other controlling device. If the read operation is part of a program verify operation, the program verify has failed. If the second calculated CRC code matches the provided CRC code, the read data is indicated as a passed read operation 413.

Figure 5:
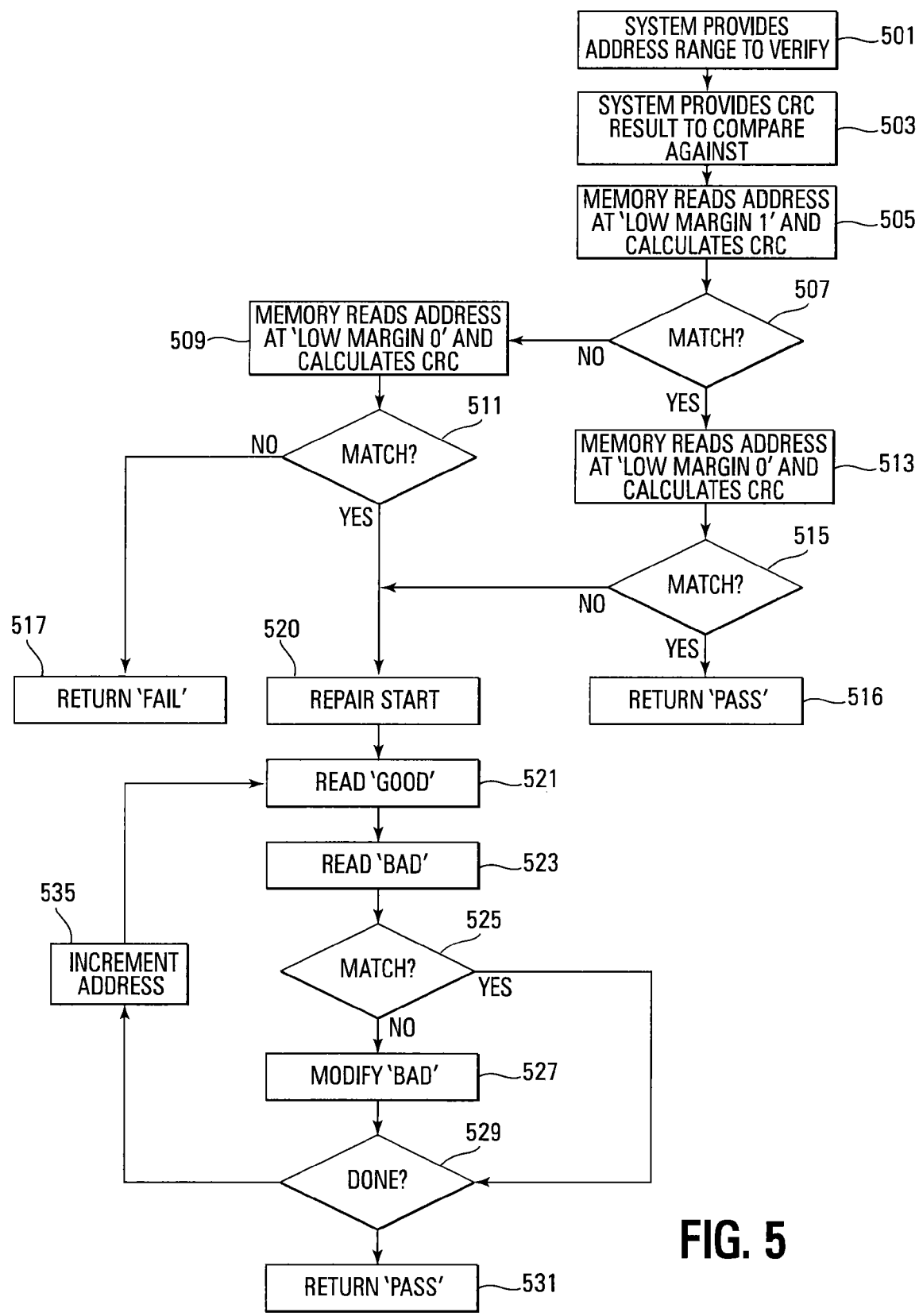
FIG. 5 shows a flow chart of an alternate embodiment of a method for a low margin read operation and automatic repair operation using a CRC comparison.

FIG. 5 illustrates a flow chart of an alternate embodiment of a method for a low margin read operation using a CRC comparison that includes an automatic bit repair operation. This method can not only be used to detect if a program verify has passed but can also repair data that has failed the program verify.

The memory address range of memory cells to be read (e.g., program verified) is received from a system host 501. The host has also computed the CRC code for the data to be read and transmits that CRC code to the memory device for later comparison 503.

The memory device (e.g., memory control circuitry) reads the memory cells in the address range using the low margin '1' reference voltage and uses the read data to calculate a first CRC code 505. This determines if the memory cell has been programmed above the low margin '1' reference voltage. The first calculated CRC code is compared with the CRC code provided by the system host 507.

If the first calculated CRC code matches the provided CRC code, the memory device reads the memory cells in the address range using the low margin '0' reference voltage and uses the read data to calculate a second CRC code 513. This step determines if the memory cell has been programmed above the low margin '0' reference voltage. If the two CRC codes match 515, the data has passed 516. If the read is part of a program verify operation, the program verify is indicated as passed 516. If the two CRC codes do not match 515, the data has failed but can be repaired. In this case, a repair operation can be started 520.

If the first calculated CRC code does not match the provided CRC code, the memory device reads the memory cells in the address range using the low margin '0' reference voltage and calculates a third CRC code 509. If the two CRC codes do not match, the read data is unknown and cannot be repaired. The read operation is indicated as having failed 517 to the system host or other controller device. If the read operation is part of a program verify operation, the program verify has failed.

If the third calculated CRC code matches the provided CRC code, the data can be repaired. In this case, a repair operation can then be started 520. The repair operation reprograms the bad data with good data (e.g., known data). The good data has been stored in buffers in the memory device prior to programming and is, thus, typically still accessible.

The repair operation begins at a first address of the received range of addresses and comprises reading the "good" data 521 from the buffer where it was stored prior to the programming operation. The "bad" data is read 523 and compared 525 to the good data. If the comparison indicates that the "bad" data matches the "good" data, the data at that particular address do not have to be repaired. If this is the last address in the range of addresses to be read, the repair operation is done 529 and the operation is indicated as passed 531. If additional addresses remain to be read, the address is incremented 535 and the repair process is repeated on subsequent memory cells in the address range.

If the comparison indicates that the "bad" data does not match the "good" data 525, the "bad" data is replaced with the "good" data 527. This can be accomplished by biasing the failed memory cell with further programming pulses until the cell passes the program verify. Once the data has been repaired 527, if additional addresses remain to be read, the address is incremented 535 and the repair process is repeated on subsequent memory cells in the address range.

Figure 6:
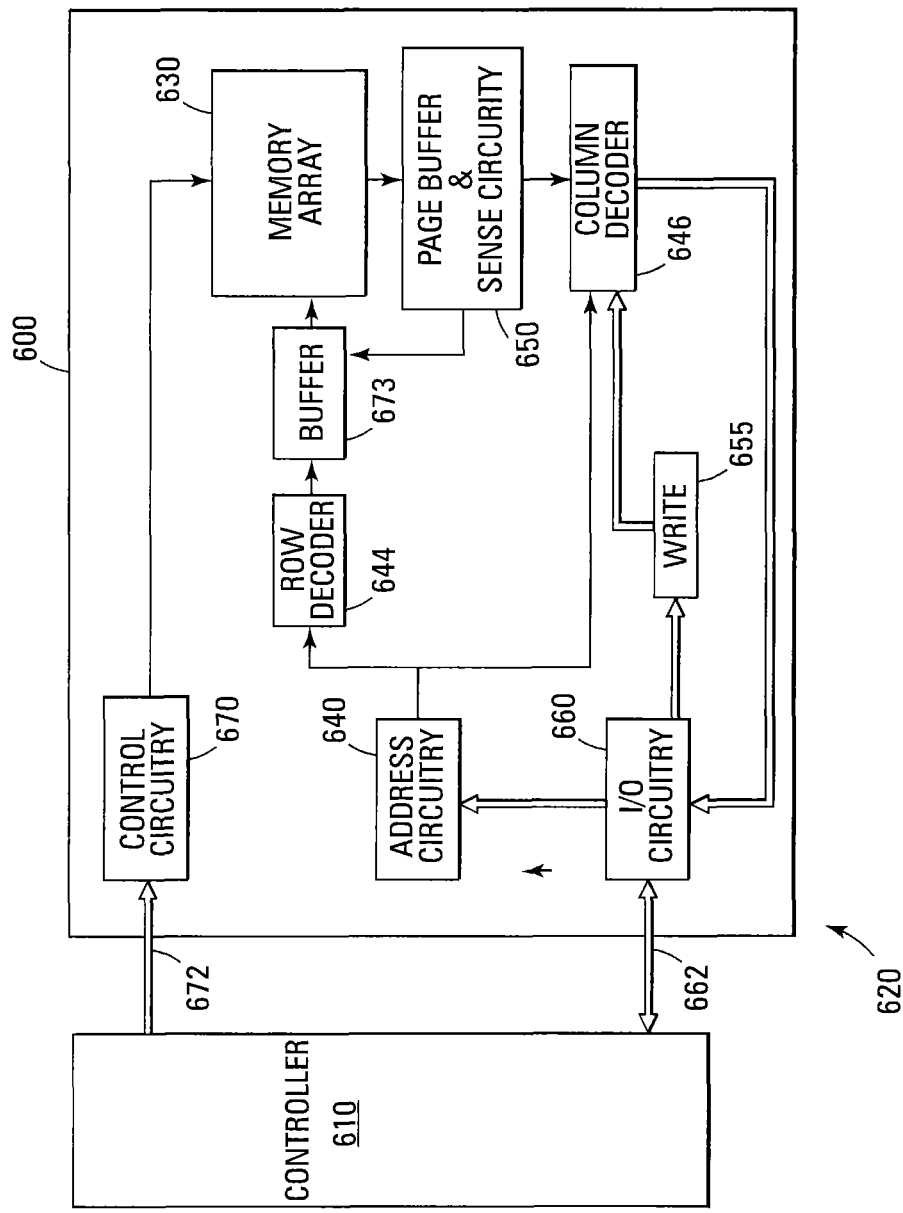
FIG. 6 shows a block diagram of one embodiment of a system that can incorporate

FIG. 6 illustrates a functional block diagram of a memory device 600 that can be read using the low margin read method embodiments disclosed herein. The memory device 600 is coupled to an external controller 610. The external controller 610 may be a microprocessor or some other type of controller. The memory device 600 and the external controller 610 form part of a system 620.

The memory device 600 includes an array 630 of memory cells. The memory array 630 is arranged in banks of word line rows and bit line columns. One example of a portion of the memory array 630 is illustrated in FIG. 2 and described previously.

Address buffer circuitry 640 is provided to latch address signals provided through I/O circuitry 660. Address signals are received and decoded by a row decoder 644 and a column decoder 646 to access the memory array 630. Buffers can be coupled between the row decoder 644 and the memory array 630 that store data to be programmed to the memory array 630.

The memory device 600 reads data in the memory array 630 by sensing changes in the memory array columns using sense circuitry 650. The sense circuitry 650, in one embodiment, is coupled to read and latch a row of data from the memory array 630 in a page buffer 650. The sense circuitry 650, as previously described, includes the sense circuitry as well as other circuits for performing a program verify operation. Data are input and output through the I/O circuitry 660 for bidirectional data communication as well as the address communication over a plurality of data connections 662 with the controller 610.

Memory control circuitry 670 decodes signals provided on a control interface 672 from the external controller 610. These signals are used to control the operations on the memory array 630, including data read, data write (program), and erase operations. The memory control circuitry 670 may be a state machine, a sequencer, or some other type of controller to generate the memory control signals. In one embodiment, the memory control circuitry 670 is configured to control execution of the low margin read embodiments of the present disclosure.

The memory device illustrated in FIG. 6 has been simplified to facilitate a basic understanding of the features of the memory. A more detailed understanding of internal circuitry and functions of flash memories are known to those skilled in the art.

CONCLUSION

In summary, one or more embodiments of the low margin read with CRC comparison performs both a read operation using low margin reference voltages while also comparing a calculated CRC code resulting from the read with a received CRC code of known, good data. In an alternate embodiment, a repair operation can be performed to repair the bad data.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A method for a low margin read operation comprising:
reading data from a memory cell using a first reference voltage;
generating a first cyclic redundancy check code in response to the read data;
comparing the first generated cyclic redundancy check code to a known cyclic redundancy check code of known data;
indicating a failed read when the first generated cyclic redundancy check code does not match the known cyclic redundancy check code;
reading data from the memory cell using a second reference voltage and generating a second cyclic redundancy check code in response to data from the second reference voltage when the first generated cyclic redundancy check code matches the known cyclic redundancy check code; and
indicating a passed read when the second cyclic redundancy check code matches the known cyclic redundancy check code.

2. The method of claim 1 and further comprising indicating the failed read when the second cyclic redundancy check code does not match the known cyclic redundancy check code.

3. The method of claim 1 and further comprising receiving the known cyclic redundancy check code of the known data.

4. The method of claim 1 and further comprising receiving a range of addresses of memory cells to be read.

5. The method of claim 1 wherein the low margin read operation is a program verify operation.

6. The method of claim 1 wherein the first reference voltage is less than the second reference voltage.

7. A method for a low margin read operation comprising:
receiving an address range of memory cells to be read;
receiving a known cyclic redundancy check code corresponding to known data to be programmed to a memory cell of the address range;
reading data from the memory cell using a first reference voltage;
generating a first cyclic redundancy check code in response to the data;
comparing the first generated cyclic redundancy check code to the known cyclic redundancy check code;
indicating a failed read when the first generated cyclic redundancy check code does not match the known cyclic redundancy check code;
reading data from the memory cell using a second reference voltage and generating a second cyclic redundancy check code in response to data from the second reference voltage when the first generated cyclic redundancy check code matches the known cyclic redundancy check code; and
indicating a passed read when the second cyclic redundancy check code matches the known cyclic redundancy check code.

8. The method of claim 7 and further comprising indicating a failed read when the second cyclic redundancy check code does not match the known cyclic redundancy check code.

9. The method of claim 7 and further comprising performing a repair operation responsive to indicating the failed read when the first generated cyclic redundancy check code does not match the known cyclic redundancy check code, the repair operation comprising:
reading known data from a buffer;
reading data from the memory cell; and
modifying the data from the memory cell in response to the known data.

10. The method of claim 9 and further comprising incrementing an address of the memory cell to another address in the address range prior to repeating the repair operation.

11. The method of claim 9 wherein modifying the data from the memory cell in response to the known data comprises:
comparing the data from the memory cell to the known data;
if the known data matches the data from the memory cell, indicating a passed read; and
if the known data does not match the data from the memory cell, writing the known data to the memory cell.

12. The method of claim 11 wherein writing the known data to the memory cell comprises applying further programming pulses to the memory cell.

13. The method of claim 9 and further comprising, prior to performing the repair operation:

reading data from the memory cell using a second reference voltage and generating a second cyclic redundancy check code in response to data from the second reference voltage when the first generated cyclic redundancy check code does not match the known cyclic redundancy check code.

14. An apparatus comprising:
an array of memory cells; and
memory control circuitry coupled to the array of memory cells and configured to control reading of a memory cell of the array of memory cells, the memory control circuitry configured to read data from a memory cell using a first reference voltage, generate a first cyclic redundancy check code in response to the read data, compare the first generated cyclic redundancy check code to a known cyclic redundancy check code of known data, indicate a failed read when the first generated cyclic redundancy check code does not match the known cyclic redundancy check code, read data from the memory cell using a second reference voltage and generate a second cyclic redundancy check code in response to data from the second reference voltage when the first generated cyclic redundancy check code matches the known cyclic redundancy check code, and indicate a passed read when the second cyclic redundancy check code matches the known cyclic redundancy check code.

15. The apparatus of claim 14 and further comprising a buffer coupled to the array of memory cells and configured to store the known data to be programmed to the array of memory cells.

16. The apparatus of claim 15 wherein the memory control circuitry is further configured to repair bad data with the known data from the buffer.

17. The apparatus of claim 16 wherein the memory control circuitry is further configured to read the known data from the buffer, read data from the memory cell, and modify the data from the memory cell when the known data and the read data do not match.

18. The apparatus of claim 17 wherein the memory control circuitry is further configured to control application of additional programming pulses to the memory cell when the known data and the read data do not match.

19. The apparatus of claim 15 wherein the memory control circuitry is further configured to repair bad data from a failed read.

20. A system comprising:
a controller configured to control the system; and
a memory device coupled to the controller, the memory device comprising:
an array of memory cells; and
control circuitry coupled to the array of memory cells and configured to control a program verify of a plurality of memory cells of the array of memory cells within an address range, the control circuitry configured to read data from a memory cell of the plurality of memory cells in response to a first reference voltage, generate a first cyclic redundancy check code in response to the read data, compare the first generated cyclic redundancy check code to a known cyclic redundancy check code of known data, indicate a failed program verify when the first generated cyclic redundancy check code does not match the known cyclic redundancy check code, read data from the memory cell in response to a second reference voltage that is greater than the first reference voltage and generate a second cyclic redundancy check code in response to data from the second reference voltage when the first generated cyclic redundancy check code matches the known cyclic redundancy check code, and indicate a passed program verify when the second cyclic redundancy check code matches the known cyclic redundancy check code.

21. The apparatus of claim 20 wherein the control circuitry is further configured to receive the known data and the known cyclic redundancy check code from the controller.

22. The system of claim 20 wherein the control circuitry is further configured to increment through the address range and control repair of memory cells that fail the program verify.

23. The system of claim 20 wherein the controller is configured to generate the known cyclic redundancy check code responsive to the known data.

24. The system of claim 22 wherein the control circuitry is further configured to store the known data in a buffer prior to controlling programming of the memory array.

25. The system of claim 24 wherein the control circuitry is further configured to control repair of memory cells that fail the program verify responsive to data read from the buffer.

* * * * *

UNITED STATES PATENT AND TRADEMARK OFFICE
CERTIFICATE OF CORRECTION

PATENT NO. : 8,923,068 B2  
APPLICATION NO. : 13/663915  
DATED : December 30, 2014  
INVENTOR(S) : Nicholas Hendrickson et al.

Page 1 of 1

It is certified that error appears in the above-identified patent and that said Letters Patent is hereby corrected as shown below:

Title Page, Item (54), and in the Specification, column 1, line 2, in "Title", delete "COMPARISION" and insert -- COMPARISON --, therefor.

In the Claims

In column 8, line 29, in Claim 21, delete "apparatus" and insert -- system --, therefor.

Signed and Sealed this
Twenty-fourth Day of March, 2015

Michelle K. Lee
*Director of the United States Patent and Trademark Office*